(12) United States Patent
Nakai

(10) Patent No.: US 12,119,137 B2
(45) Date of Patent: Oct. 15, 2024

(54) CONNECTION STRUCTURE OF HIGH TEMPERATURE SUPERCONDUCTING WIRES, METHOD FOR FORMING SAME, HIGH TEMPERATURE SUPERCONDUCTING WIRE, AND HIGH TEMPERATURE SUPERCONDUCTING COIL

(71) Applicant: FURUKAWA ELECTRIC CO., LTD., Tokyo (JP)

(72) Inventor: Akinobu Nakai, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 313 days.

(21) Appl. No.: 17/782,488

(22) PCT Filed: Dec. 4, 2020

(86) PCT No.: PCT/JP2020/045328
§ 371 (c)(1),
(2) Date: Jun. 3, 2022

(87) PCT Pub. No.: WO2021/112250
PCT Pub. Date: Jun. 10, 2021

(65) Prior Publication Data
US 2023/0005644 A1    Jan. 5, 2023

(30) Foreign Application Priority Data
Dec. 5, 2019 (JP) .................. 2019-220412

(51) Int. Cl.
*H01B 12/00* (2006.01)
*H01B 12/02* (2006.01)
(Continued)

(52) U.S. Cl.
CPC .............. *H01B 12/02* (2013.01); *H01F 6/06* (2013.01); *H01R 4/68* (2013.01); *H01R 43/00* (2013.01)

(58) Field of Classification Search
CPC .............. H01R 4/68; H01B 12/06; H01F 6/06
See application file for complete search history.

(56) References Cited

U.S. PATENT DOCUMENTS

2017/0288323 A1   10/2017   Sato
2018/0204658 A1   7/2018    Osabe et al.
(Continued)

FOREIGN PATENT DOCUMENTS

CN   106663503 A   5/2017
CN   107438887 A   12/2017
(Continued)

OTHER PUBLICATIONS

Extended European Search Report Issued Nov. 17, 2023 in European Patent Application No. 20895414.9, 10 pages.
(Continued)

*Primary Examiner* — Jeremy C Norris
(74) *Attorney, Agent, or Firm* — Oblon, McClelland, Maier & Neustadt, L.L.P.

(57) ABSTRACT

A connection structure of high-temperature superconducting wires includes first and second superconducting wires which are high-temperature superconducting wires respectively having a base material consisting of metal or alloy, and an oxide superconducting layer formed on the base material. A joint portion containing a superconducting connection portion between the first and second superconducting wires joins the first and second superconducting wires in a positional relationship facing the surfaces of first and second superconducting layers which are the oxide superconducting layers of each of the first and second superconducting wires, (Continued)

are opposed to each other. In a base material of at least one superconducting wire among the first and second superconducting wires, a first portion constituting the joint portion is thicker than a second portion not constitute the joint portion in the same base material.

20 Claims, 4 Drawing Sheets

(51) Int. Cl.
    *H01F 6/06* (2006.01)
    *H01R 4/68* (2006.01)
    *H01R 43/00* (2006.01)

(56) References Cited

U.S. PATENT DOCUMENTS

| | | |
|---|---|---|
| 2018/0218809 A1 | 8/2018 | Nakai et al. |
| 2020/0028061 A1 | 1/2020 | Nakai et al. |

FOREIGN PATENT DOCUMENTS

| | | |
|---|---|---|
| CN | 108028106 A | 5/2018 |
| CN | 110462938 A | 11/2019 |
| JP | 58-5309 U | 1/1983 |
| JP | 2007-266149 A | 10/2007 |
| JP | 2011-18536 A | 1/2011 |
| JP | 2013-235699 A | 11/2013 |
| JP | 2014-130730 A | 7/2014 |
| JP | 2018-170173 A | 11/2018 |
| WO | WO 2018/181561 A1 | 10/2018 |

OTHER PUBLICATIONS

International Search Report mailed on Mar. 2, 2021 in PCT/JP2020/045328 filed on Dec. 4, 2020 (2 pages).

Combined Chinese Office Action and Search Report issued Sep. 9, 2023 in Chinese Application 202080082693.7 (with unedited computer-generated English translation), 21 pages.

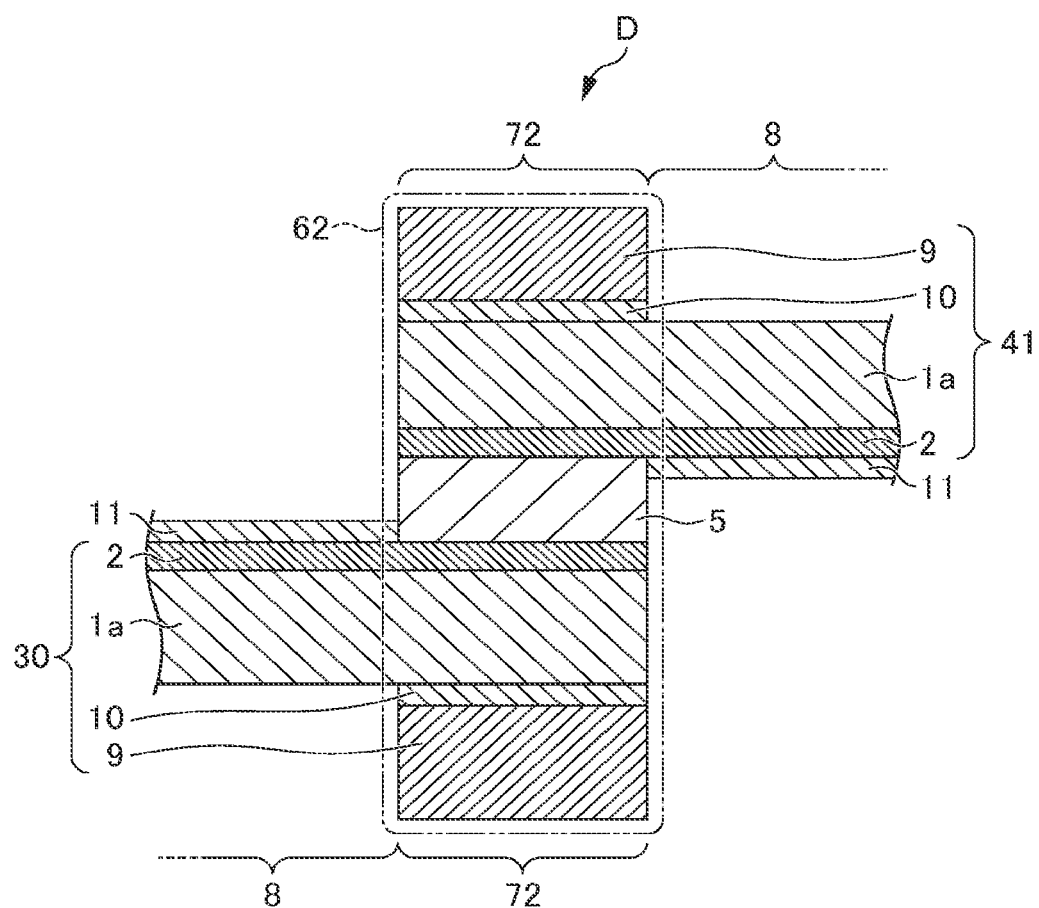

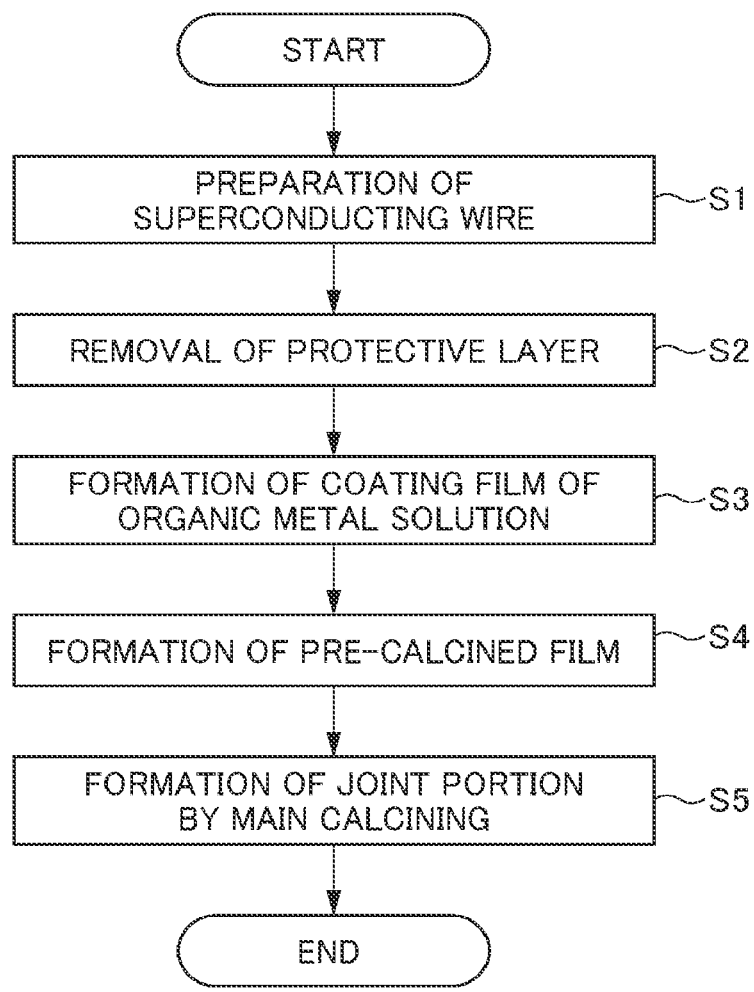

CONNECTION STRUCTURE OF HIGH TEMPERATURE SUPERCONDUCTING WIRES, METHOD FOR FORMING SAME, HIGH TEMPERATURE SUPERCONDUCTING WIRE, AND HIGH TEMPERATURE SUPERCONDUCTING COIL

TECHNICAL FIELD

The present invention relates to a connection structure of high temperature superconducting wires, a formation method thereof, a high temperature superconducting wire, and a high temperature superconducting coil.

BACKGROUND ART

A superconducting wire on which an oxide superconducting layer is formed on the base material made of metal (hereinafter may be referred to simply as "superconducting wire"), due to the electrical current loss being low, for example, is used as a winding of a magnetic coil such as an MRI (Magnetic Resonance Imaging) device or NMR (Nuclear Magnetic Resonance) device. However, it is necessary to form a closed loop with such a coil and to connect the superconducting wires in order to carry the permanent current.

As a method of connecting superconducting wires, for example, Patent Document 1 proposes a technique using a MOD method (coating pyrolysis method: Metal Organic Deposition method). The connection of the superconducting wires by this MOD method joins by removing each protective layer of connection ends of the two superconducting wires, applying an MOD solution containing metal constituting the oxide superconducting layer on the surface of the exposed oxide superconducting layer by the spin coating method or the spray coating method to form the MOD coating film and allowing to dry, followed by heating to the crystallization temperature of the oxide superconducting layer, while pressurizing and contacting the above-mentioned MOD films of these two superconducting wires. As the above-mentioned MOD solution, for example, an acetyl acetonate-based MOD solution in which RE (rare-earth element such as Y (yttrium), Gd (gadolinium), Sm (samarium) and Ho (holmium)), Ba (barium) and Cu (copper) are contained in a proportion of about 1:2:3 can be used. It thereby becomes possible to connect the two superconducting wires with lower resistance than a joint by soldering.

Patent Document 1: Japanese Unexamined Patent Application, Publication No. 2013-235699

DISCLOSURE OF THE INVENTION

Problems to be Solved by the Invention

However, with a structure made by joining two superconducting wires in which an oxide superconducting layer is formed on the base material made of metal in this way, due to the difference in each thermal expansion coefficient of the oxide superconducting layer and the base material made of metal, from repetitive changes of thermal expansion and thermal contraction by heat cycling or the like accompanying aging, at the two joined superconducting wires, there have been problems such as bending deformation tends to occur such that the joining (connecting) surfaces of the oxide superconducting layers separate at the width end positions when looking in a width-direction cross section of the joint portion, a result of which the contact area of the joint portion becomes smaller, and the two oxide superconducting layers forming the joint portion tend to peel.

The present invention was made taking account of the above-mentioned problem, and has an object of providing a connection structure of high temperature superconducting wires, a formation method thereof, as well as a high temperature superconducting wire and a high temperature superconducting coil, which can effectively suppress peeling of a superconducting layer constituting two superconducting wires forming a joint portion, even if repetitive thermal deformation of thermal expansion and thermal contraction due to heat cycling or the like, by trying optimization of the base material of at least one superconducting wire among two superconducting wires on which an oxide superconducting layer is formed on the base material made of metal.

Means for Solving the Problems

The present inventor found that it is possible to effectively prevent peeling of a superconducting layer at a superconducting connection portion, by effectively suppressing bending deformation of two superconducting wires forming a joint portion, even if repetitive thermal deformation of thermal expansion and thermal contraction due to heat cycling or the like occurs, by the base material of at least one superconducting wire among a first superconducting wire and a second superconducting wire having, in the same base material, a first portion constituting the joint portion being thicker than a second portion not constituting the joint portion, upon forming the joint portion containing a superconducting connection portion formed between the first superconducting wire and the second superconducting wire by joining the first superconducting wire and the second superconducting wire on which an oxide superconducting layer is formed on the base material made of metal.

In other words, the key configurations of the present invention are as follows.

A connection structure of high temperature superconducting wires according to a first aspect of the present invention includes: a first superconducting wire and a second superconducting wire which are two high temperature superconducting wires respectively having a band-shaped base material consisting of metal or alloy, and an oxide superconducting layer formed on a surface side of the base material; and a joint portion containing a superconducting connection portion formed between the first superconducting wire and the second superconducting wire, the joint portion joining the first superconducting wire and the second superconducting wire in a positional relationship facing the surfaces of the first superconducting wire and the second superconducting layer, which are the oxide superconducting layers of each of the first superconducting wire and the second superconducting wire towards, each other, in which, in a base material of at least one superconducting wire among the first superconducting wire and the second superconducting wire, a first portion constituting the joint portion is thicker than a second portion not constituting the joint portion in the same base material.

According to a second aspect of the present invention, in the connection structure of the high temperature superconducting wires as described in the first aspect, in the base material of the at least one superconducting wire, the first portion is configured by at least two base materials including a first base material which is the base material, and a fragment-like second base material located at a back side of the first base material.

According to a third aspect of the present invention, in the connection structure of the high temperature superconducting wires as described in the second aspect, the at least one superconducting wire satisfies relationships of $\alpha1>\alpha3$ and $\alpha2>\alpha3$, when defining thermal expansion coefficient of the first base material as $\alpha1$, thermal expansion coefficient of the second base material as $\alpha2$, and thermal expansion coefficient of the oxide superconducting layer as $\alpha3$.

According to a fourth aspect of the present invention, in the connection structure of the high temperature superconducting wires as described in any one of the first to third aspects, the thermal expansion coefficient $\alpha1$ of the first base material is $10.5\times10^{-6}/K$ or more.

According to a fifth aspect of the present invention, the connection structure of the high temperature superconducting wires as described in any one of the second to fourth aspects further includes a metal layer between the first base material and the second base material, the metal layer having a melting point higher than 800° C., and a characteristic of hardly undergoing high temperature oxidizing.

According to a sixth aspect of the present invention, in the connection structure of the high temperature superconducting wires as described in the fifth aspect, the metal layer is formed from at least one noble metal selected from Ag, Au and Pt, or an alloy thereof.

According to a seventh aspect of the present invention, the connection structure of the high temperature superconducting wires as described in any one of the second to sixth aspects further includes a ceramic layer on a back surface of the second base material.

According to an eighth aspect of the present invention, in the connection structure of the high temperature superconducting wires as described in any one of the first to seventh aspects, the base material of the at least superconducting wire has a thickness of the first portion of 60 μm or more and 100 μm or less, and a thickness of the second portion of 30 μm or more and 55 μm or less.

According to a ninth aspect of the present invention, in the connection structure of the high temperature superconducting wires as described in any one of the first to eighth aspects, the oxide superconducting layers of the first superconducting wire and the second superconducting wire both have a thickness of 0.5 μm or more.

According to a tenth aspect of the present invention, in the connection structure of the high temperature superconducting wires as described in any one of the first to ninth aspects, the oxide superconducting layers of the first superconducting wire and the second superconducting wire both consist of REBCO-based superconducting material.

A high temperature superconducting wire according to an eleventh aspect of the present invention includes the connection structure as described in any one of the first to tenth aspects.

A high temperature superconducting coil according to a twelfth aspect of the present invention includes the high temperature superconducting wire as described in the eleventh aspect.

A formation method of a connection structure of high temperature superconducting wires according to a thirteenth aspect of the present invention includes: a coating film formation step of forming a coating film by coating an organometallic solution containing a metal forming a superconducting connection portion and allowing to dry, on a surface portion of an exposed oxide superconducting layer by separating a part of protective layers of each of a first superconducting wire and a second superconducting wire, which are two high temperature superconducting wires respectively having a band-shaped base material consisting of metal or alloy, the oxide superconducting layer formed on a surface side of the base material, and the protective layer formed on a surface of the oxide superconducting layer; a pre-calcining step of forming a pre-calcining film by heating the coating film to a first temperature; and a main calcining step of forming a superconducting connection portion between the first superconducting wire and the second superconducting wire, by bringing surfaces of the pre-calcined films of the first superconducting wire and the second superconducting wire on which the pre-calcined films are formed into contact in a positional relationship facing each other, and heating to a second temperature which is higher than the first temperature, and forming a joint portion which joins the first superconducting wire and the second superconducting wire by the superconducting connection portion, in which, in the base material of at least one superconducting wire among the first superconducting wire and the second superconducting wire, a first portion constituting the joint portion is thicker than a second portion not constituting the joint portion in the same base material, at least prior to performing the main calcining step.

Effects of the Invention

According to the present invention, it is possible to provide a connection structure for high temperature superconducting wires at a connection portion of superconducting layers upon connecting superconducting wires in which an oxide superconducting layer is formed on a base material made of metal, the connection structure being capable of suppressing peeling of the two superconducting layers forming a joint portion, even if repetitive thermal deformation of heat expansion and heat contraction due to heat cycling, etc. occur, by effectively thickening the thickness of the base material made of metal, as well as a formation method thereof, and a high temperature superconducting wire and a high temperature superconducting coil.

BRIEF DESCRIPTION OF THE DRAWINGS

FIG. 4 is a cross-sectional view schematically showing a connection structure of superconducting wires of a fourth embodiment according to the present invention.

FIG. 5 is a flowchart showing a formation method of a connection structure of the superconducting wires of the second embodiment according to the present invention.

PREFERRED MODE FOR CARRYING OUT THE INVENTION

Hereinafter, embodiments of the present invention will be explained in detail. However, the present invention is not to be limited to the following embodiments.

First Embodiment (Connection Structure of High Temperature Superconducting Wires)

Figure 1:
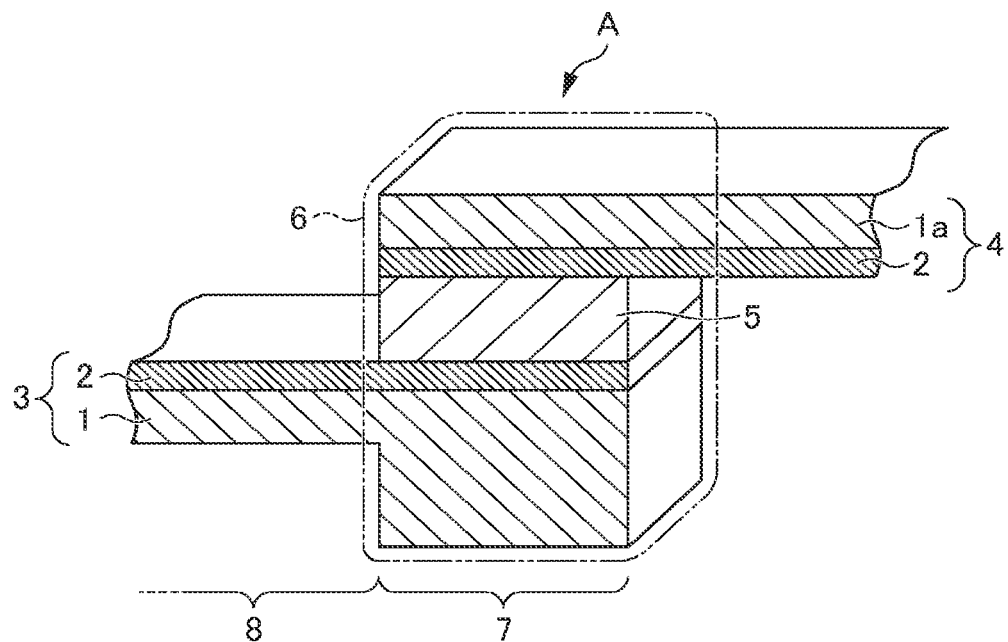
FIG. 1 is a perspective view schematically showing a connection structure of superconducting wires of a first embodiment according to the present invention.

FIG. 1 is a perspective view schematically showing a connection structure of high temperature superconducting wires (hereinafter may be referred to as "superconducting wire" or "superconducting wires") according to a first embodiment. A connection structure A of the superconducting wires according to the first embodiment, as shown in FIG. 1, includes: a first superconducting wire 3 (hereinafter simply referred to as "superconducting wire 3") and a second superconducting wire (hereinafter simply referred to as "superconducting wire 4") which are high temperature superconducting wires having superconducting layers 2, 2 consisting of oxide superconducting layers (hereinafter simply referred to as "superconducting layer") respectively formed on a surface side of band-shaped base materials 1, 1 and the base materials 1, 1 consisting of metal or alloy; and a joint portion 6 containing a superconducting connection portion 5 formed between the first superconducting wire 3 and the second superconducting wire 4, by joining the first superconducting wire 3 and the second superconducting wire 4 in a positional relationship making the surfaces of the superconducting layers 2, 2 of the superconducting wire 3 and the superconducting wire 4 to face each other, in which the base material 1 of at least one superconducting wire ("first superconducting wire" in FIG. 1) among the first superconducting wire 3 and the second superconducting wire 4, in the same base material 1, has a first portion 7 constituting the joint portion 6 thicker than a second portion 8 not constituting the joint portion 6.

(Base Material)

The base material 1 is configured by a band-shaped metal substrate or alloy substrate. As the material of the base material 1, for example, it is possible to exemplify metals such as Co (cobalt), Cu (copper), Cr (chromium), Ni (nickel), Ti (titanium), Mo (molybdenum), Nb (niobium), Ta (tantalum), W (tungsten), Mn (manganese), Fe (iron) and Ag (gold), which are superior in strength and heat resistance, or alloys of these. In particular, from the viewpoint of corrosion resistance and heat resistance, it is preferable to use Ni-based alloys such as Hastelloy (registered trademark) and Inconel (registered trademark), or Fe-based alloys such as stainless steel, and particularly, it is more preferable to use a Ni—Fe—Mo-based alloy of which Hastelloy (registered trademark) is representative. Herein, the respective thermal expansion coefficients of Co, Cu, Cr, Ni, Ti, Mo, Nb, Ta, W, Mn, Fe, Ag, Hastelloy (registered trademark), Inconel (registered trademark) and stainless steel exemplified as materials constituting a first base material 1 which can be used in the present invention are shown in Table 1.

TABLE 1

| Metal or alloy constituting first base material | Thermal expansion coefficient ($\times 10^{-6}$/K) |
|---|---|
| Co | 12.3 (20° C.) |
| Cu | 16.5 (20° C.) |
| Cr | 4.9 (20° C.) |
| Ni | 13.4 (20° C.) |
| Ti | 8.5 (20° C.) |
| Mo | 4.9 (20° C.) |
| Nb | 7.1 (20° C.) |
| Ta | 6.4 (20° C.) |
| W | 4.5 (20° C.) |
| Mn | 22.0 (20° C.) |
| Fe | 11.8 (20° C.) |

TABLE 1-continued

| Metal or alloy constituting first base material | Thermal expansion coefficient ($\times 10^{-6}$/K) |
|---|---|
| Ag | 19.7 (20° C.) |
| Hastelloy C276 (registered trademark) | 10.8~11.3 (20° C.) |
| Inconel 600 (registered trademark) | 11.5~13.3 (20~1000° C.) |
| Stainless steel (SUS304) | 17.3 (0~100° C.) |

Among these metals or alloys, it is preferable to configure the first base material 1 by Co, Cu, Ni, Mn, Fe, Hastelloy (registered trademark), Inconel (registered trademark) or stainless steel, which are metals or alloys having a thermal expansion coefficient of $10.5 \times 10^{-6}$/K or more in the present invention. If configuring in this way, a connection structure B having superior corrosion resistance and heat resistance can be obtained.

(Superconducting Layer)

The superconducting layer 2 is an oxide superconducting layer, and is formed on a top surface side of the base material 1. The superconducting layer 2 is formed from an oxide superconducting layer having higher transition temperature of the superconducting layer than the boiling point of liquid nitrogen (−196° C.: 77 K), and is particularly preferably configured from a REBCO-based superconducting material ($REBa_2Cu_3O_{7-\delta}$) which is a rare earth-based high temperature superconducting material. As the REBCO-based oxide superconducting material, for example, a superconducting layer such as $REBa_2Cu_3O_{7-\delta}$ (RE-based superconducting layer) is preferable. It should be noted that RE is a single rare-earth element such as Y (yttrium), Nd (neodymium), Sm (samarium), Eu (europium), Gd (gadolinium), Dy (dysprosium), Ho (holmium), Er (erbium), Tm (thulium), Yb (ytterbium) and Lu (lutetium), or a plurality of rare-earth elements. In addition, $\delta$ is the oxygen nonstoichiometric amount, and is 0 to 1, for example, and is preferably close to 0 from the viewpoint of having high superconducting transition temperature. It should be noted that the oxygen nonstoichiometric amount, if performing high-pressure oxygen annealing or the like using a device such as an autoclave, may be less than 0, i.e. may assume a negative value. The thickness of the superconducting layer 2 is preferably 0.1 to 10 μm, and is more preferably 0.5 to 5 μm, when considering the harmony of the performance, mechanical strength and productivity.

(Joint Portion)

The joint portion 6 has a superconducting connection portion 5 formed between the superconducting layer 2 of the first superconducting wire 3 and the superconducting layer 2 of the second superconducting wire 4; and the superconducting layer 2 of the first superconducting wire 3 and the superconducting layer 2 of the second superconducting wire 4 respectively contacting with the superconducting connection portion 5. The superconducting connection portion 5 is preferably configured from a composition of a superconducting layer which is the same as the superconducting layer 2, and particularly can be formed using a composition (solution) in which the raw materials required in the formation of the RE-based superconducting layer are contained. As such a solution, for example, it is possible to use an acetyl acetonate-based, or naphthenate-based MOD solution in which RE (rare-earth elements such as Y, Gd, Sm and Ho), Ba and Cu are contained in proportions of about 1:2:3. After coating the MOD solution on the top surface of each of the first superconducting wire 3 and the second superconducting wire 4, and allowing to dry to form a coating film, it is possible to obtain a crystalline superconducting connection portion 5, by heating and calcining up to the crystallization temperature (for example 760 to 800° C.) of the oxide superconducting layer, while contacting and pressurizing both of the above-mentioned coating films of these two superconducting wires.

(Relationship of Thicknesses of First Portion and Second Portion)

In the present embodiment, the base material 1 of at least one of the superconducting wires ("first superconducting wire 3" in FIG. 1) among the first superconducting wire 3 and the second superconducting wire 4 configures, by making the first portion 7 constituting the joint portion 6 to be thicker than the thickness of the second portion 8 not constituting the joint portion 6 of the base material 1 in the same base material 1, so as to raise the rigidity of the first portion 7 during heating and subsequent cooling upon forming the connection structure A of the superconducting wire of the first embodiment, and thus the deformation amount of the joint portion overall including the first portion 7 becomes smaller. In the present invention, by causing the thermal deformation of the first portion 7 during heating and cooling by heat treatment to decline, by making the effective thickness of the first portion 7 thicker than the effective thickness of the second portion 8 in this way, it is possible to make the deformation amounts of the first portion 7, the superconducting layer 2 and the joint portion 6 smaller, thereby suppressing bending of the connection structure A of the superconducting wire. For the base material 1 of the first superconducting wire 3, which is the above-mentioned at least one superconducting wire, it is preferable for the thickness of the first portion 7 to be 60 μm or more and 100 μm or less and the thickness of the second portion 8 to be 30 μm or more and 55 μm or less, and more preferable for the thickness of the first portion 7 to be 70 μm or more and 150 μm or less and the thickness of the second portion 8 to be 30 μm or more and 50 μm or less. If configured in this way, even if repeating heating and subsequently cooling upon forming the connection structure A for relatively many times, it is possible to appropriately reconcile the rigidity of the first portion 7, the deformation amount of the joint portion overall including the first portion 7 and the high temperature superconducting wire, and thus improve the effect of suppressing the bending of the connection structure A. It should be noted that, herein, as the connection structure A of the superconducting wire according to the first embodiment, although an example of forming the first portion 7 only in the first superconducting wire 3 as shown in FIG. 1 is explained, the connection structure A is not limited to only such an example and, for example, the first portion 7 may be formed in both the first superconducting wire 3 and the second superconducting wire 4, and configured so that the first portions 7, 7 become a substantially symmetrical positional relationship with each other. If configured in this way, it is possible to further improve the effect of suppressing the bending of the connection structure A of the superconducting wire of the first embodiment.

Second Embodiment

Next, a connection structure B of superconducting wires of a second embodiment according to the present invention will be explained. It should be noted that, in the second to fourth embodiments explained below, for portions redundant with the first embodiment, explanations thereof will be omitted, and only portions differing from the first embodiment will be explained. In addition, the constitutional elements of the connection structure of the superconducting wires shall be assigned the same reference numbers for the constitutional elements identical to the first embodiment.

Figure 2:
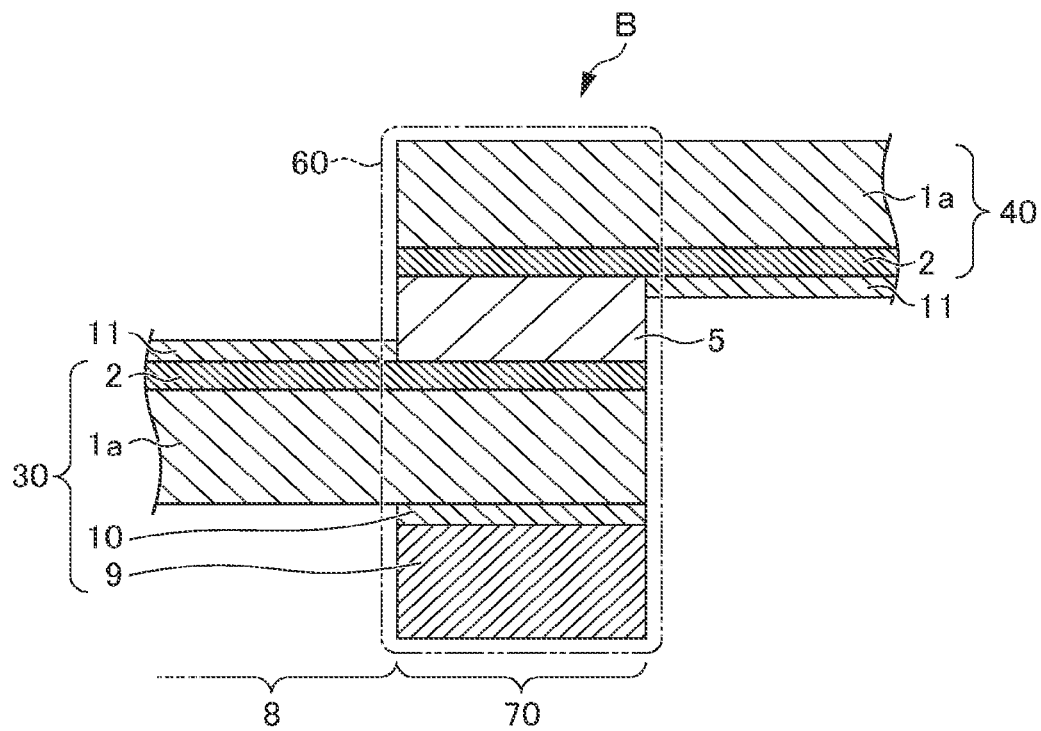
FIG. 2 is a cross-sectional view schematically showing a connection structure of superconducting wires of a second embodiment according to the present invention.

FIG. 2 is a cross-sectional diagram schematically showing the connection structure B of the superconducting wires according to the second embodiment. The connection structure A of the first embodiment has a structure in which the effective thickness of the first portion 7 constituting the joint portion 6 is thicker than the effective thickness of the second portion 8 not constituting the joint portion 6; whereas, the connection structure B of the second embodiment makes the effective thickness of the first portion 70 constituting the joint portion 60 thicker than the effective thickness of the second portion 8 not constituting the joint portion 60, by the first portion 70 constituting the joint portion 60 arranging a fragment-like second base material 9 on the back side opposite to the surface on which the superconducting layer 2 of the first base material 1a is positioned. In other words, in place of the first superconducting wire 3 constituting the connection structure A, the connection structure B adopts a first superconducting wire 30 (hereinafter may simply be referred to as "superconducting wire 30") having the fragment-like second base material 9 in which the first portion 70 is arranged at the back side of the first base material 1a, and is configured to have the second superconducting wire 40 (hereinafter may simply be referred to as "superconducting wire 40") arranged to oppose the superconducting wire 30, having the first base material 1a and the superconducting layer 2 arranged on the surface side of the first base material 1a, and constituting the joint portion 60 via the superconducting connection portion 5 by opposing this superconducting layer 2 with the superconducting layer 2 of the superconducting wire 30.

In the present embodiment, by the first portion 70 of the superconducting wire 30 including the fragment-like second base material 9 positioned on the back side of the first base material 1a, the thickness of the first portion 70 is made thicker than the thickness of the second portion 8 by the thickness of the second base material 9. According to the present embodiment, by appropriately selecting the second base material 9 from among materials having various thermal expansion coefficients, it is possible to set the extent of the bending effect of the connection structure B of the high temperature superconducting wires to the desired extent.

(Fragment-Like Second Base Material)

With the second base material 9, in order to further raise the effect of suppressing the bending of the connection structure B of the superconducting wires, it is preferable to configure so as to satisfy the relationships of α1>α3 and α2>α3, when defining the thermal expansion coefficient of the first base material 1a as α1, the thermal expansion coefficient of the second base material 9 as α2, and the thermal expansion coefficient of the superconducting layer 2 as α3. If configuring in this way, during heating and cooling upon forming the connection structure B of the superconducting wires of the second embodiment, the deformation amount of the first portion 70 becomes even smaller compared to that of the second portion 8, and thus it is possible to more effectively suppress the bending of the connection structure B of the superconducting wires of the second embodiment. It should be noted that, herein, as the connection structure B according to the second embodiment, although an example forming the second base material 9 only in the first portion 70 of the superconducting wire 30 as shown in FIG. 2 is explained, the connection structure B is not limited to only such an example and, for example, the second base material 9 may be formed on both the superconducting wire 30 and the superconducting wire 40 and may be configured so that the first portions 70, 70 become a substantially symmetrical positional relationship with each other. If configured in this way, it is possible to further improve the effect of suppressing the bending of the connection structure B of the superconducting wires of the second embodiment.

In the case of the first base material 1a being configured by Hastelloy C276 (registered trademark), Inconel 600 (registered trademark) or stainless steel (SUS304) exemplified in the first embodiment, since the thermal expansion coefficients of these are $11.2 \times 10^{-6}$ (25 to 1000° C.), 11.5 to $13.3 \times 10^{-6}$/K (20 to 100° C.), $17.3 \times 10^{-6}$/k (0 to 100° C.), respectively, Ti (thermal expansion coefficient: $8.4 \times 10^{-6}$/K (20° C.)) and Pt ($8.8 \times 10^{-6}$/K (25° C.)) can be exemplified as the material of the fragment-like second base material 9 satisfying the above relationship (1), for example. Alternatively, the second base material 9 may be configured by the same material as the first base material 1a.

(Metal Layer)

In the superconducting wire 30, it is preferably formed the metal layer 10 as a layer joining the first base material 1a and the second base material 9 between the first base material 1a and the second base material 9. The metal layer 10 is preferably configured by metal having a melting point higher than 800° C., and having a characteristic of hardly undergoing high temperature oxidizing. If configuring in this way, the connection structure B of the superconducting wires is obtained having raised adhesion and joining strength between the first base material 1a and the second base material 9 by the metal layer 10, and having heat resistance to the heat treatment temperature (760 to 800° C.) upon forming the superconducting connection portion 5 by the aforementioned MOD method. The metal layer 10 having such characteristics is preferably formed by at least one noble metal selected from the group consisting of Ag, Au and Pt or an alloy thereof. If forming the metal layer 10 by at least one noble metal selected from the group consisting of Ag, Au and Pt or the alloy thereof, it is possible to relatively simply form the metal layer 10 superior in the above-mentioned bondability and heat resistance.

The superconducting wires 30, 40 preferably further have a protective layer 11 coating over the entire surface of the conductive layer 2 excluding the superconducting connection portion 5. By configuring in this way, it is possible to effectively protect without exposing the surface of the superconducting layers 2, 2. The protective layer 11 is preferably a metal or alloy layer containing at least one among Ag, Au and Cu, and is more preferably a metal layer of Ag. The thickness of the protective layer 11 is preferably 1 to 50 µm, and is more preferably 1.5 to 5 µm. In the case of forming the protective layer 11 on the surface of the superconducting layers 2, 2, it is possible to effectively protect without exposing the surfaces of the superconducting layers 2, 2.

Third Embodiment

Figure 3:
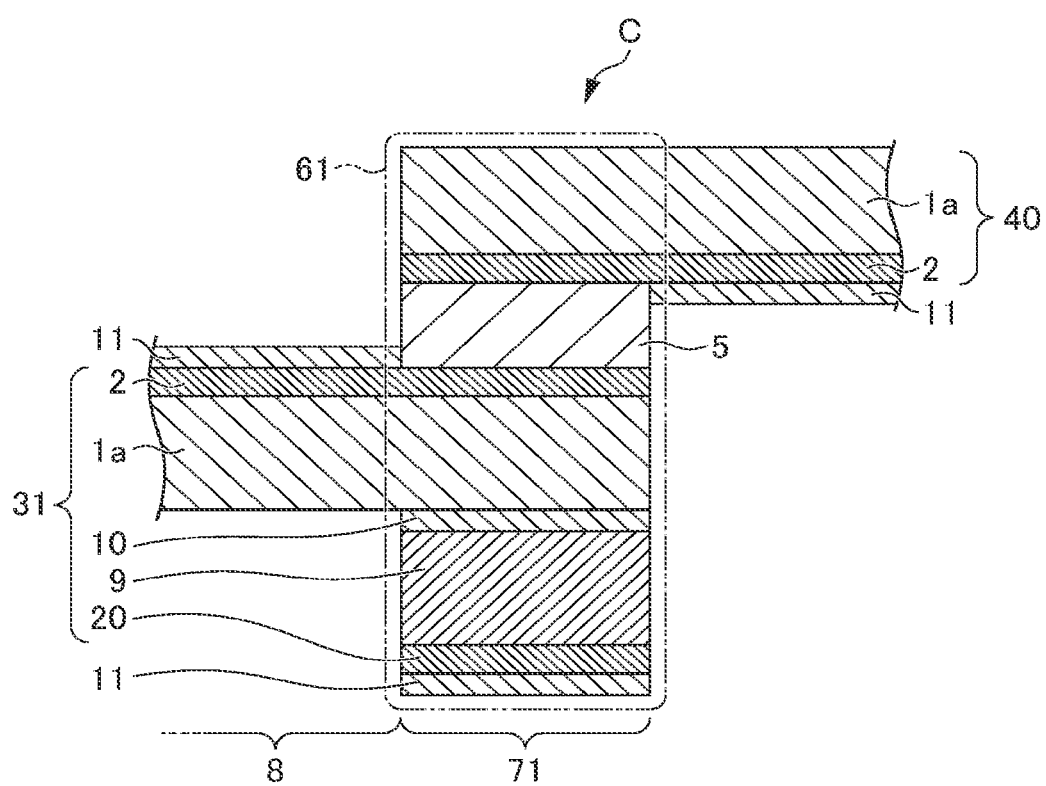
FIG. 3 is a cross-sectional view schematically showing a connection structure of superconducting wires of a third embodiment according to the present invention.

Next, a connection structure C of the superconducting wires of a third embodiment according to the present invention will be explained. FIG. 3 is a cross-sectional view schematically showing the connection structure C according to the third embodiment. The first portion 7 of the connection structure A of the first embodiment and the first portion 70 of the connection structure B of the second embodiment are configured by only metal material; whereas, in the connection structure C of the third embodiment, a portion of the first superconducting wire 31 (hereinafter, may be referred to simply as "superconducting wire 31") constituting the joint portion 61 is configured in the laminating order of the superconducting layer 2, the first base material 1a, the metal layer 10, the second base material 9, the ceramic layer 20 and the protective layer 11. It should be noted that the connection structure C referred to herein is configured to include the first superconducting wire 31, the second superconducting wire 40, and the joint portion 61 formed between the first superconducting wire 31 and the second superconducting wire 40.

(Ceramic Layer Arranged on Side of Fragment-Like Second Base Material Facing First Base Material)

The ceramic layer 20, by being arranged on the back side positioned on the opposite side to the surface on which the metal layer 10 of the second base material 9 is positioned, drastically improves the reduction effect on the bending, by making the thermal deformation amount after heat treatment of the first portion 71 small compared to the thermal deformation amount after heat treatment of each of the first portion 7 of the connection structure A and the first portion 70 of the connection structure B. In other words, the ceramic material exerts an effect whereby the thermal deformation amount after heat treatment in the MOD method or the like declines in the connection structure C forming the ceramic layer 20 on the back side of the second base material 9, due to the thermal expansion coefficient of the ceramic material being small compared to that of the metal material in general. It should be noted that, herein, as the connection structure C according to the third embodiment, although an example forming the second base material 9 having the ceramic layer 20 only on the first portion 71 of the superconducting wire 31 as shown in FIG. 3 is explained, the connection structure C is not to be limited to only such an example and, for example, the second base material 9 may be formed on both the superconducting wire 31 and the superconducting wire 40, and configured so that the first portion 71, 71 become a substantially symmetrical positional relationship with each other. If configured in this way, it is possible to further improve the effect of suppressing the bending of the connection structure C of the superconducting wire of the third embodiment. The ceramic materials suitable as the ceramic layer used in the present invention are not particularly limited. In the present invention, it is particularly preferable to configure the ceramic layer 20 by the same material as the superconducting layer 2. The thermal expansion coefficients of each of the ceramic materials constituting the superconducting layer 2 and other major ceramic materials are shown in Table 2.

TABLE 2

| Ceramic material | Thermal expansion coefficient ($\times 10^{-6}$/K) |
|---|---|
| Alumina ($Al_2O_3$) | 7.0~7.2 (40~400° C.) |
| Silicon nitride ($Si_3N_4$) | 2.6 (40~400° C.) |
| Zirconia ($ZrO_2$) | 10.5 (40~400° C.) |
| Aluminum nitride (AlN) | 4.6 (40~400° C.) |
| Silicon carbide (SiC) | 4.4 (40~400° C.) |
| Titania ($TiO_2$) | 9.6~11.5 (40~400° C.) |
| yttria ($Y_2O_3$) | 7.2 (40~400° C.) |
| $YBa_2Cu_3O_x$ | 11.3 (−130° C.~190° C.) |

Fourth Embodiment

Next, a connection structure D of superconducting wires of a fourth embodiment according to the present invention will be explained. FIG. 4 is a cross-sectional view schematically showing the connection structure D according to the fourth embodiment. In the connection structures A, B, C of the first to third embodiments, the first portions 7, 70, 71 are formed only on the back side of one superconducting wire among the first superconducting wire and the second superconducting wire included in each connection structure, and the respective effective thicknesses of the first portions 7, 70, 71 constituting each of the joint portions 6, 60, 61 are made thicker; whereas, in the connection structure D of the fourth embodiment, the reduction in bending of the connection structure of the high temperature superconducting wire is achieved by forming the fragment-like second base materials 9, 9 on the respective back sides of the first base materials 1a, 1a constituting the joint portions 62 of both of the above-mentioned first superconducting wire 30 and the above-mentioned second superconducting wire 41 via each of the metal layers 10, 10, forming the first portions 72, 72 and the second portions 8, 8 on each of the first superconducting wire 30 and the second superconducting wire 41, and making the respective effective thicknesses of the first portions 72 thicker than the respective effective thicknesses of the second portions 8. In other words, the connection structure D has a configuration forming the fragment-like second base materials 9, 9 via the metal layers 10, 10 on the back side of each of the first base materials 1a, 1a constituting the joint portion 62, as the configuration of the second superconducting wire 41, in place of the second superconducting wire 40 of the connection structure B. It should be noted that the connection structure D referred to herein is configured to include the first superconducting wire 30, the second superconducting wire 41, and the joint portion 62 formed between the first superconducting wire 30 and the second superconducting wire 41.

If configured in this way, due to the synergy from making the effective thicknesses of both the first portion 72 of the first superconducting wire 30 and the first portion 72 of the second superconducting wire 41 thicker, it becomes possible to obtain the connection structure D for which the reduction effect of the bending is further improved compared to the first to third embodiments. It should be noted that, as explained in the third embodiment, if forming the ceramic layers 20, 20 respectively on each back side of the two first portions 72, 72 constituting the joint portion, the above-mentioned reduction effect of the bending can be further improved. On this occasion, if forming the ceramic layer 20 with the same material as the superconducting layer 2, it is possible to still further improve the above-mentioned reduction effect on the bending. Furthermore, it is possible to form the protective layers 11, 11 similarly to the third embodiment on each of these ceramic layers 20, 20.

(High Temperature Superconducting Wire Having Connection Structure of High Temperature Superconducting Wire)

For the connection structure of the high temperature superconducting wires of the aforementioned embodiments, even if repetitive thermal deformation of thermal expansion and thermal contraction due to heat cycling and the like occur, it is suitable to adopt in various high temperature superconducting wires required to suppress the peeling of the two superconducting layers forming the joint portion, e.g., the winding of the magnetic coils of MRI, NMR, etc.

(Formation Method of Connection Structure of High Temperature Superconducting Wires)

A formation method of the connection structures A, B, C, D of the high temperature superconducting wires of the present embodiment will be explained. It should be noted that, herein, the formation method of the connection structure B (FIG. 2) will be explained, however, the formation methods of the connection structures A, C, D are basically the same. As shown in FIG. 5, first, the first superconducting wire 30 and the second superconducting wire 40 are prepared which are two superconducting wires having the band-shaped base material 1 consisting of metal or alloy, the oxide superconducting layer 2 formed on the surface side of the base material 1 and the protective layer 11 formed on the surface of the oxide superconducting layer 2. Thereamong, at least one superconducting wire 30 among the first superconducting wire 30 and the second superconducting wire 40 was prepared in which the first portion 70 constituting the joint portion 60 of the base material 1 was formed to be thicker than the second portion 8 not constituting the joint portion 60, or alternatively, for the first portion 70 constituting the joint portion 60, the first portion 70 constituting the joint portion 60 was thicker than the second portion 8 not constituting the joint portion 60 (Step S1 of preparing superconducting wire). Next, parts of the protective layers 11, 11 of each of the first superconducting wire 30 and the second superconducting wire 40 prepared in Step S1 are removed by peeling to expose the oxide superconducting layers 2, 2 (Step S2 of removing protective layer). Next, a coating film is formed by applying an organometallic solution containing metal forming the superconducting connection portion 5 on the surface portions of the oxide superconducting layers 2,2 exposed in Step S2, and then allowing to dry (Step S3 of forming coating film of organometallic solution). Subsequently, the organic substances in the coating film are removed to form a pre-calcining film, by heating the coating film formed in Step S3 to the first temperature (preferably 450 to 550° C.) (Step S4 of forming pre-calcining film). Next, a main calcining step is performed of forming the superconducting connection portion 5 between the first superconducting wire 30 and the second superconducting wire 40 by bringing the pre-calcining films of the first superconducting wire 30 and the second superconducting wire 40 having the pre-calcining films formed in Step S4 into contact in a positional relationship facing each other, and heating to the second temperature (preferably 760 to 820° C.) which is higher than the first temperature, and then forming the joint portion 60 by the first superconducting wire 30 and the second superconducting wire 40 as well as the superconducting connection portion 5 (Step S5 of forming joint portion by main calcining). By performing Step S1 to Step S5 in order in this way, even if repetitive thermal deformation of thermal expansion and thermal contraction due to heat cycling or the like occurs, it is possible to form a connection structure of high temperature superconducting wires capable of effectively suppressing peeling of the superconducting layers constituting the two superconducting wires forming the joint portion. Additionally, in the present embodiment, after Step S5, an oxygen supplemented heat treatment may be further performed of conducting heat treatment under an oxygen atmosphere, and supplementing oxygen to oxygen deficient parts in the film constituting the joint portion.

EXAMPLES

Next, in order to further clarify the effects of the present invention, Examples and Comparative Examples will be explained, however, the present invention is not to be limited to these Examples.

(Preparation of Sample Material)

First, as the high temperature superconducting wire (hereinafter, may be referred to simply as "superconducting wire"), a superconducting wire was prepared by sequentially forming the superconducting layer 2 consisting of GdBCO of 1.6 μm thickness and the protective layer 11 consisting of Ag of 2 μm thickness on the surface of the base material 1 made of Hastelloy (registered trademark) of 50 μm thickness and 6 m width, and forming the metal layer 10 consisting of Ag of 2 μm thickness on the back thereof (refer to FIG. 2). Next, for the above-mentioned superconducting wire, after coating the MOD solution on the removed part made by removing part of the above-mentioned protective layer 11 to form the MOD coating film, the organic solvent in the above-mentioned MOD coating film was evaporated under a mixed gas atmosphere of nitrogen and oxygen at 500° C. and the superconducting wire on which the MOD pre-calcined film was formed on the surface side was prepared, and this was defined as the sample material.

Example 1

To the back side which is the opposite side to the surface side of the above-mentioned MOD pre-calcined film of the above-mentioned sample material, one test material made by arranging the base material 9 made of Hastelloy (registered trademark) having 50 μm thickness, 20 mm length and 6 mm width (hereinafter may be referred to as "dummy substrate 9 made of Hastelloy (registered trademark)), and one test material made by not arranging the above-mentioned dummy substrate 9 made of Hastelloy (registered trademark) were prepared. Next, after arranging the surface sides of the above-mentioned MOD pre-calcined film of each of these to face each other, the main calcining was performed under condition of 800° C. heating temperature and 100 MPa pressure under a mixed gas atmosphere of argon gas and oxygen gas, and the two superconducting wires 30, 40 were joined by forming the joint portion 60 consisting of the crystalline MOD layer, by crystallizing the above-mentioned MOD pre-calcined film. By configuring in this way, for the one superconducting wire 30 among the two superconducting wires 30, 40, the connection structure B of the superconducting wire in which the first portion 70 constituting the joint portion 60 is thicker than the second portion 8 not constituting the above-mentioned joint portion was prepared, and this was defined as Example 1 (refer to FIG. 2).

Example 2

Two test materials were prepared by arranging the above-mentioned dummy substrate 9 made of Hastelloy (registered trademark) on the back side of the above-mentioned sample material which is the opposite side to the surface side of the above-mentioned MOD pre-calcined film. Next, after arranging the surface sides of the above-mentioned MOD pre-calcined film of each of these to face each other, the main calcining was performed under condition of 800° C. heating temperature and 100 MPa pressure under a mixed gas atmosphere of argon gas and oxygen gas, and the two superconducting wires 30, 41 were joined by forming the joint portion 62 consisting of the crystalline MOD layer, by crystallizing the above-mentioned MOD pre-calcined film. By configuring in this way, for the above-mentioned two superconducting wires 30, 41, the connection structure D of the superconducting wire having the first portions 72, 72 constituting the joint portion 62 thicker than the second portions 8, 8 not constituting the joint portion 62 was prepared, and this was defined as Example (refer to FIG. 4).

Example 3

To the back side which is the opposite side to the surface side of the above-mentioned MOD pre-calcined film of the above-mentioned sample material, two test materials were prepared by arranging the base substrate 9 made of carbon steel having 50 μm thickness, 20 mm length and 6 mm width (hereinafter may be referred to as "dummy substrate 9 made of carbon steel"). Next, after arranging the surface sides of the above-mentioned MOD pre-calcined film of each of these to face each other, the main calcining was performed under condition of 800° C. heating temperature and 100 MPa pressure under a mixed gas atmosphere of argon gas and oxygen gas, and the two superconducting wires 30, 41 were joined by forming the joint portion 62 consisting of the crystalline MOD layer, by crystallizing the above-mentioned MOD pre-calcined film. By configuring in this way, for the two superconducting wires 30, 41, the connection structure D of the superconducting wire having the first portions 72, 72 constituting the joint portion 62 thicker than the second portions 8, 8 not constituting the joint portion 62 was prepared, and this was defined as Example 3 (refer to FIG. 4.).

Example 4

Two test materials were prepared by arranging the back side of the above-mentioned sample material having 50 μm thickness, 20 mm length and 6 mm width to be facing the back side of the above-mentioned sample material which is the opposite side to the surface side of the above-mentioned MOD pre-calcined film. Next, after arranging the surface sides of the above-mentioned MOD pre-calcined film of each of these to face each other, the main calcining was performed under condition of 800° C. heating temperature and 100 MPa pressure under a mixed gas atmosphere of argon gas and oxygen gas, and the two superconducting wires were joined by forming the joint portion consisting of the crystalline MOD layer, by crystallizing the above-mentioned MOD pre-calcined film. By configuring in this way, for the two superconducting wires, a connection structure of the superconducting wire having a portion of the superconducting wire constituting a joint portion thicker than a portion of the superconducting wire not constituting the above-mentioned joint portion was prepared, and this was defined as Example 4 (not shown).

COMPARATIVE EXAMPLE

Two of the above-mentioned sample materials were prepared, the MOD pre-calcined films of these sample materials were made to face each other, the main calcining was performed under condition of 800° C. heating temperature and 100 MPa pressure under a mixed gas atmosphere of argon gas and oxygen gas, and the above-mentioned MOD pre-calcined films were crystallized, thereby forming a joint portion consisting of the crystallized MOD layer. By configuring in this way, for both of the above-mentioned two superconducting wires, a connection structure of the superconducting wire in which the portion of the superconducting wire constituting the above-mentioned joint portion and the portion of the superconducting wire not constituting the above-mentioned joint portion have the same thickness was prepared, and this was defined as a Comparative Example.

Evaluation

In order to confirm the reduction effect on bending of the Examples 1 to 4 and the Comparative Example 1, the following tests were performed to investigate the extent of the peeling property, and evaluation was performed. The results thereof are shown in Table 3.

TABLE 3

|  | No peeling | Partial peeling | Peeling |
|---|---|---|---|
| Example 1 | 4 | 3 | 3 |
| Example 2 | 8 | 1 | 1 |
| Example 3 | 7 | 2 | 1 |
| Example 4 | 10 | 0 | 0 |
| Comparative Example | 1 | 5 | 4 |

According to the results shown in Table 3, it was clarified that, by arranging the above-mentioned base material made of Hastelloy (registered trademark), the above-mentioned base material made of carbon steel or the above-mentioned superconducting wire on the superconducting wire constituting the above-mentioned joint portion, since the portion of the superconducting wire constituting the above-mentioned joint portion becomes thicker than the portion of the superconducting wire not constituting the above-mentioned joint portion, Examples 1 to 4 have remarkably higher proportion of "no peeling", and lowered proportions of "partial peeling" and "peeling" compared to the Comparative Example in which the portion of the superconducting wire constituting the above-mentioned joint portion and the portion of the superconducting wire not constituting the above-mentioned joint portion have the same thickness, and thus the reduction effect on the bending improved. In particular, for the connection structure arranging the base material of the same material as the superconducting wire on the superconducting wire constituting the joint portion of both of the two superconducting wires contained in the connection structure of the above-mentioned superconducting wires, the evaluation result of "no peeling" was obtained in all samples, and the reduction effect on the bending remarkably improved. It should be noted that, although evaluation was performed on the connection structure arranging the base material made of various stainless steels or the base material made of various Inconels (registered trademark) as a metal other than the above-mentioned base material made of Hastelloy (registered trademark) and the above-mentioned base material made of carbon steel, to the superconducting wire constituting the above-mentioned joint portion, for example, or the connection structure arranging $Al_2O_3$, for example, as the base material containing a ceramic material other than the above-mentioned superconducting wire, the evaluation results of such connection structures have remarkably high proportions of "no peeling", and lowered proportions of "partial peeling" and "peeling" compared to the Comparative Example, and thus it was confirmed that the reduction effect on the bending improved.

If applying the connection structure of the high temperature superconducting wires according to the present invention to a high temperature superconducting wire, or a high temperature superconducting coil formed using this high temperature superconducting wire, even if repetitive thermal deformation of thermal expansion and thermal contraction due to heat cycling or the like occurs, since it is possible to effectively suppress peeling of the superconducting layer constituting two superconducting wires forming the joint portion, it is possible to exhibit stable superconductivity property.

Although embodiments of the present invention have been explained above, the present invention is not to be limited to the above such embodiments, and includes all modes included in the technical concept of the present invention and scope of the claims, and various modifications can be made within the scope of the present invention.

EXPLANATION OF REFERENCE NUMERALS 1, 1a base material, first base material
2 oxide superconducting layer
3, 30, 31 first superconducting wire
4, 40, 41 second superconducting wire
5 superconducting connection portion
6, 60, 61, 62 joint portion
7, 70, 71, 72 first portion
8 second portion
9 base material, second base material
10 metal layer
11 protective layer
20 ceramic layer
A connection structure of first embodiment
B connection structure of second embodiment
C connection structure of third embodiment
D connection structure of fourth embodiment

The invention claimed is:

1. A connection structure of high temperature superconducting wires comprising:
a first superconducting wire and a second superconducting wire which are two high temperature superconducting wires respectively having a band-shaped base material consisting of metal or alloy, and an oxide superconducting layer formed on a surface side of the base material; and
a joint portion containing a superconducting connection portion formed between the first superconducting wire and the second superconducting wire, the joint portion joining the first superconducting wire and the second superconducting wire in a positional relationship facing the surfaces of the first superconducting layer and the second superconducting layer, which are the oxide superconducting layers of each of the first superconducting wire and the second superconducting wire towards, each other,
wherein, in a base material of at least one superconducting wire among the first superconducting wire and the second superconducting wire, a first portion constituting the joint portion is thicker than a second portion not constituting the joint portion in the same base material.

2. The connection structure of the high temperature superconducting wires according to claim 1, wherein, in the base material of the at least one superconducting wire, the first portion is configured by at least two base materials including a first base material which is the base material, and a fragment-like second base material located at a back side of the first base material.

3. The connection structure of the high temperature superconducting wires according to claim 2, wherein the at least one superconducting wire satisfies relationships of $\alpha 1 > \alpha 3$ and $\alpha 2 > \alpha 3$,
when defining thermal expansion coefficient of the first base material as $\alpha 1$, thermal expansion coefficient of the second base material as $\alpha 2$, and thermal expansion coefficient of the oxide superconducting layer as $\alpha 3$.

4. The connection structure of the high temperature superconducting wires according to claim 3, further comprising a metal layer between the first base material and the second base material, the metal layer having a melting point higher than 800° ° C., and a characteristic of hardly undergoing high temperature oxidizing.

5. The connection structure of the high temperature superconducting wires according to claim 3, further comprising a ceramic layer on a back surface of the second base material.

6. The connection structure of the high temperature superconducting wires according to claim 2, further comprising a metal layer between the first base material and the second base material, the metal layer having a melting point higher than 800° C., and a characteristic of hardly undergoing high temperature oxidizing.

7. The connection structure of the high temperature superconducting wires according to claim 6, wherein the metal layer is formed from at least one noble metal selected from Ag, Au and Pt, or an alloy thereof.

8. The connection structure of the high temperature superconducting wires according to claim 2, further comprising a ceramic layer on a back surface of the second base material.

9. The connection structure of the high temperature superconducting wires according to claim 2, wherein the thermal expansion coefficient α1 of the first base material is $10.5 \times 10^{-6}$/K or more.

10. The connection structure of the high temperature superconducting wires according to claim 2, wherein the base material of the at least superconducting wire has a thickness of the first portion of 60 μm or more and 100 μm or less, and a thickness of the second portion of 30 μm or more and 55 μm or less.

11. The connection structure of the high temperature superconducting wires according to claim 2, wherein the oxide superconducting layers of the first superconducting wire and the second superconducting wire both have a thickness of 0.1 μm or more.

12. The connection structure of the high temperature superconducting wires according to claim 2, wherein the oxide superconducting layers of the first superconducting wire and the second superconducting wire both consist of REBCO-based superconducting material.

13. A high temperature superconducting wire comprising the connection structure according to claim 2.

14. The connection structure of the high temperature superconducting wires according to claim 1, wherein the thermal expansion coefficient α1 of the first base material is $10.5 \times 10^{-6}$/K or more.

15. The connection structure of the high temperature superconducting wires according to claim 1, wherein the base material of the at least superconducting wire has a thickness of the first portion of 60 μm or more and 100 μm or less, and a thickness of the second portion of 30 μm or more and 55 μm or less.

16. The connection structure of the high temperature superconducting wires according to claim 1, wherein the oxide superconducting layers of the first superconducting wire and the second superconducting wire both have a thickness of 0.1 μm or more.

17. The connection structure of the high temperature superconducting wires according to claim 1, wherein the oxide superconducting layers of the first superconducting wire and the second superconducting wire both consist of REBCO-based superconducting material.

18. A high temperature superconducting wire comprising the connection structure according to claim 1.

19. A high temperature superconducting coil comprising the high temperature superconducting wire according to claim 18.

20. A formation method of a connection structure of high temperature superconducting wires, the method comprising:
a coating film formation step of forming a coating film by coating an organometallic solution containing a metal forming a superconducting connection portion and allowing to dry, on a surface portion of an exposed oxide superconducting layer by separating a part of protective layers of each of a first superconducting wire and a second superconducting wire, which are two high temperature superconducting wires respectively having a band-shaped base material consisting of metal or alloy, the oxide superconducting layer formed on a surface side of the base material, and the protective layer formed on a surface of the oxide superconducting layer;
a pre-calcining step of forming a pre-calcined film by heating the coating film to a first temperature; and
a main calcining step of forming a superconducting connection portion between the first superconducting wire and the second superconducting wire, by bringing surfaces of the pre-calcined films of the first superconducting wire and the second superconducting wire on which the pre-calcined films are formed into contact in a positional relationship facing each other, and heating to a second temperature which is higher than the first temperature, and forming a joint portion which joins the first superconducting wire and the second superconducting wire by the superconducting connection portion,
wherein, in the base material of at least one superconducting wire among the first superconducting wire and the second superconducting wire, a first portion constituting the joint portion is thicker than a second portion not constituting the joint portion in the same base material, at least prior to performing the main calcining step.

* * * * *